(12) United States Patent
Yeh et al.

(10) Patent No.: US 8,370,568 B2
(45) Date of Patent: Feb. 5, 2013

(54) MEMORY INTERFACE AND ADAPTIVE DATA ACCESS METHOD

(75) Inventors: Ming-Chieh Yeh, Hsinchu (TW); Steve Wiyi Yang, Hsinchu (TW)

(73) Assignee: Mstar Semiconductor, Inc., Hsinchu (TW)

( * ) Notice: Subject to any disclaimer, the term of this patent is extended or adjusted under 35 U.S.C. 154(b) by 1027 days.

(21) Appl. No.: 12/050,369

(22) Filed: Mar. 18, 2008

(65) Prior Publication Data
US 2008/0232186 A1    Sep. 25, 2008

Related U.S. Application Data

(60) Provisional application No. 60/896,932, filed on Mar. 25, 2007.

(51) Int. Cl.
*G06F 12/00* (2006.01)

(52) U.S. Cl. .......... 711/105; 711/162; 711/E12.083

(58) Field of Classification Search .......... 711/105; 365/223.13
See application file for complete search history.

(56) References Cited

U.S. PATENT DOCUMENTS
6,118,729 A * 9/2000 Hirabayashi et al. .... 365/233.13

* cited by examiner

*Primary Examiner* — Charles Rones
*Assistant Examiner* — Baboucarr Faal
(74) *Attorney, Agent, or Firm* — Kirton McConkie; Evan R. Witt

(57) ABSTRACT

A data access method for an application circuit to access a memory. The method includes steps of: receiving a first data from the application circuit; duplicating the first data to obtain a duplicated first data; and writing the first data and the duplicated first data into the memory at continuously accessible addresses. For accessing to the first data, the first data and the duplicated first data are read from the memory in response to a rising edge and a falling edge of a data-triggering signal; and one of the first data and the duplicated first data is outputted while the other of the first data and the duplicated first data is discarded.

20 Claims, 8 Drawing Sheets

MEMORY INTERFACE AND ADAPTIVE DATA ACCESS METHOD

CROSS REFERENCE TO RELATED PATENT APPLICATION

This patent application is based on a U.S. provisional patent application No. 60/896,932 filed Mar. 25, 2007.

FIELD OF THE INVENTION

The present invention relates to a memory interface and an associated data access method, and more particularly to a memory interface and an adaptive data access method for use in a digital data-processing system.

BACKGROUND OF THE INVENTION

A system memory, which is generally implemented with a Dynamic Random Access Memory (DRAM), is essential to a digital data-processing system. Reading from or writing to a DRAM is generally controlled by a memory controller of the system, e.g. a north bridge chip or chipset of a computer system. Depending on different reading/writing designs, a variety of types of DRAMs are developed, including Synchronous DRAM (SDRAM), Double Data Rate SDRAM (DDR SDRAM), etc.

A conventional SDRAM performs data reading/writing in response to rising edges of a data-triggering signal. A DDR SDRAM, on the other hand, takes advantages of both rising and falling edges of a data-triggering signal to read/write data at a double rate. Please refer to FIG. 1, which illustrates timing sequences of a data signal DQ and a data-triggering signal (data strobe) DQS associated with a DDR memory. The data-triggering signal DQS is derived by delaying a signal DQS_0, which is generated accompanying the data signal DQ and is in phase with the data signal DQ, by a quarter of one cycle. The rising edges and falling edges of the data-triggering signal DQS thus properly locate data sections from the data signal DQ. For example, assuming that the DDR memory is operated at 400 MHz, then the frequency of the data-triggering signal DQS is 200 MHz, and the period of the data-triggering signal DQS is 5 ns ($10^{-9}$ second). In other words, the duration between a rising edge and an adjacent falling edge, i.e. half a cycle, is 2.5 ns. Meanwhile, since the duration for each data section, including level transition, in the data signal DQ is also 2.5 ns (see FIG. 1), the data-triggering signal DQS resulting from the phase-shifted signal DQS_0 can always well locate the data sections. That is, data D0 is properly read at a time point T0; data D1 is properly read at a time point T1; and so on.

However, if there is a phase difference between the phase-shifted signal DQS_0 and the data signal DQ which are supposed to be in phase, the resulting data-triggering signal DQS may thus fail to locate the data sections accurately. FIG. 2 illustrates a case that the rising and falling edges of the data-triggering signal DQS only locate transitions of data. Then data cannot be accurately read. In another case as shown in FIG. 3, a data-timing shift may exist due to inherent factors like electromagnetic interference from circuit board or environment. The data-timing shift also causes failure in accurately reading data in response to the data-triggering signal DQS. The above effects become more serious when the frequency of the data signal DQ and the data-triggering signal DQS is high.

Furthermore, if the data mentioned above is some kind of program codes or if it is required for executing a program, the data-reading or data-transmitting error may adversely affect the operation of the system.

SUMMARY OF THE INVENTION

Therefore, the present invention provides a data access method capable of flexibly adapting The present invention relates to a data access method for an application circuit to access a memory. The method includes steps of: receiving a first data from the application circuit; duplicating the first data to obtain a duplicated first data; and writing the first data and the duplicated first data into the memory at continuously accessible addresses.

For accessing the first data previously written into the memory, the first data and the duplicated first data are read from the memory in response to a rising edge and a falling edge of a data-triggering signal; and one of the first data and the duplicated first data is discarded while outputting the other of the first data and the duplicated first data to the application circuit.

The present invention also relates to a data access method for an application circuit to access a memory, which includes steps of: writing a first type of data and a second type of data into the memory; lengthening an accessible period of the first type of data; and reading the first type of data and the second type of data in response to rising and falling edges of a data-triggering signal.

In an embodiment, the accessible period of the first type of data is lengthen by: duplicating the first type of data and writing the duplicated data into the memory at an address accessible next to the original data; and triggering the reading of both the original data and the duplicated data within a single cycle of the data-triggering signal. Furthermore, one of the original data and the duplicated data is discarded and the other of the original data and the duplicated data is outputted to the application circuit.

The present invention further relates to a memory interface for an application circuit to access a memory. The memory interface includes a first interface unit in communication with the application circuit for transmitting a first type of data between the application circuit and the memory; a second interface unit in communication with the application circuit for transmitting a second type of data between the application circuit and the memory; and a control unit in communication with the first interface unit, the second interface unit and the memory for conducting a first data access operation for the first type of data and conducting a second data access operation for the second type of data; wherein the first data access operation includes repetitively reading the same contents of data.

The present invention further relates to a memory interface for an application circuit to access a memory, which includes a detecting unit in communication with the application circuit for determining a data type of a data to be accessed by the application circuit; and a control unit in communication with the detecting unit and the memory for conducting a first data access operation when the data to be accessed is a first type of data and conducting a second data access operation when the data to be accessed is a second type of data; wherein the first data access operation includes repetitively reading the same contents of data.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 4:
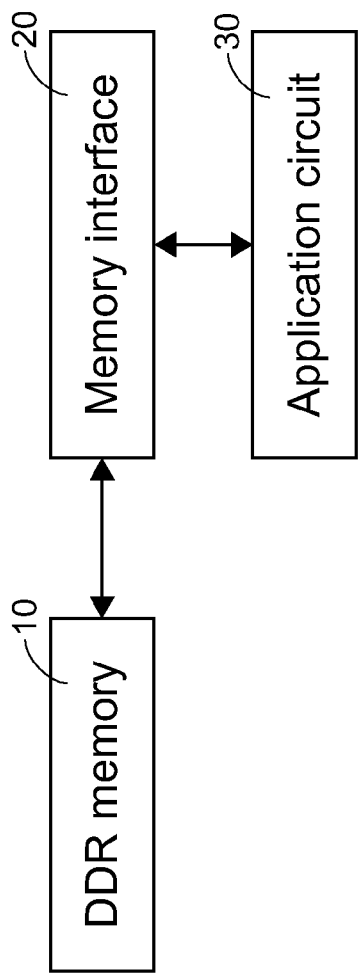
FIG. 4 is a schematic block diagram illustrating a memory access system where the present invention is applied.

In a memory access system as shown in FIG. 4, an application circuit 30 is used to control the access to a memory 10 via a memory interface 20. According to the present invention, the memory access operation is performed selectively with high efficiency or high accuracy, depending on the data type to be written to or read from the memory 20 by the application circuit 30. For example, program codes or data required for executing a system program are of high importance and classified as a first type of data. Once such data is accessed improperly, for example, accessed on transition due to the data-timing shift or triggering phase shift as previously described, the operation of the entire system is likely adversely affected or even fails. Therefore, it is preferred to access the first type of data with high accuracy. On the other hand, data such as video/audio data are of less high importance and classified as a second type of data. Although less accurate audio/video data might result in temporal output delay or slight signal distortion, such defection is ignorable and will not seriously affect the function of the entire system. Therefore, it is preferred to access the first type of data with high efficiency.

Figure 5:
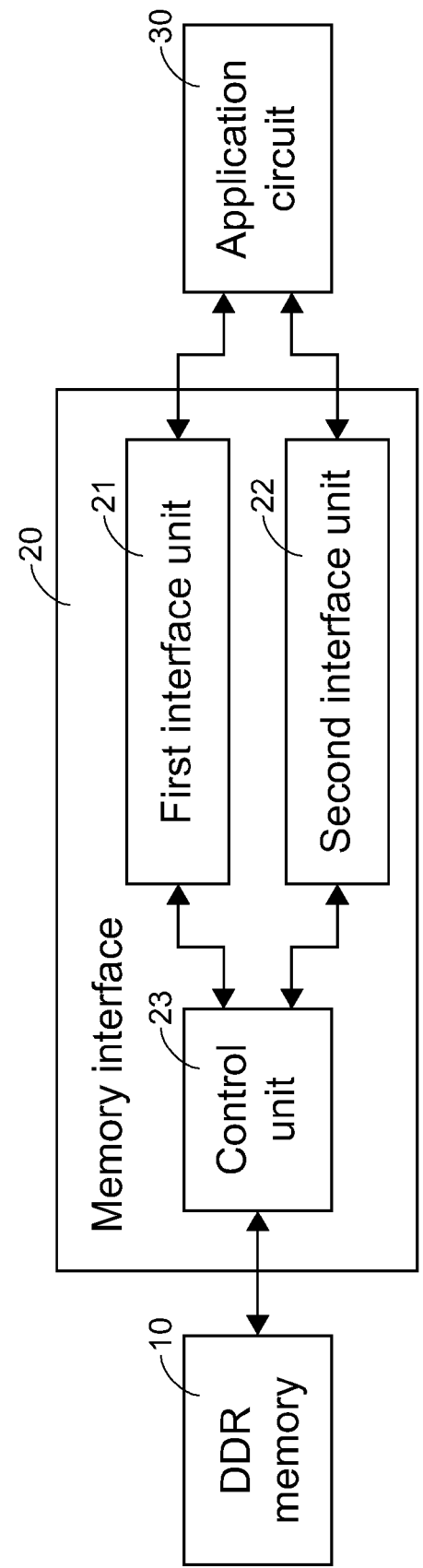
FIG. 5 is a schematic block diagram illustrating a first embodiment of memory interface according to the present invention.

In the same system, both data types may exist. For example, in an embedded system built therein a CPU and a memory and coupled thereto an external audio/video source, the data access to the memory by the CPU involves the first type of data while the data access to the memory by the external audio/video source involves the second type of data. Therefore, according to a first embodiment of the present invention as shown in FIG. 5, a first interface unit 21 and a second interface unit 22 are provided in the memory interface 20 to deal with the first type of data and the second type of data, respectively. For the data transmitted via the first interface unit 21, i.e. the first type of data, a control unit 23 executes a first data access operation, while the control unit 23 executes a second data access operation for the data transmitted via the second interface unit 22, i.e. the second type of data.

Furthermore, the memory 10 in this embodiment is a DDR memory; and the application circuit 30 can be a memory access controller, a chipset or a north bridge chip exhibiting a memory-access control function.

Figure 1:
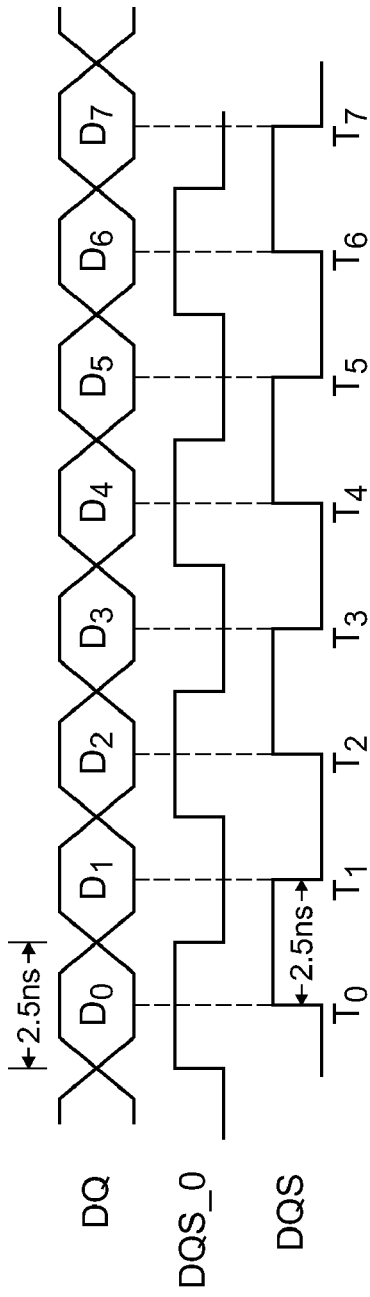
FIG. 1 illustrates ideal timing sequences of a data signal and a data-triggering signal obtained by executing a conventional DDR data access method.
Figure 2:
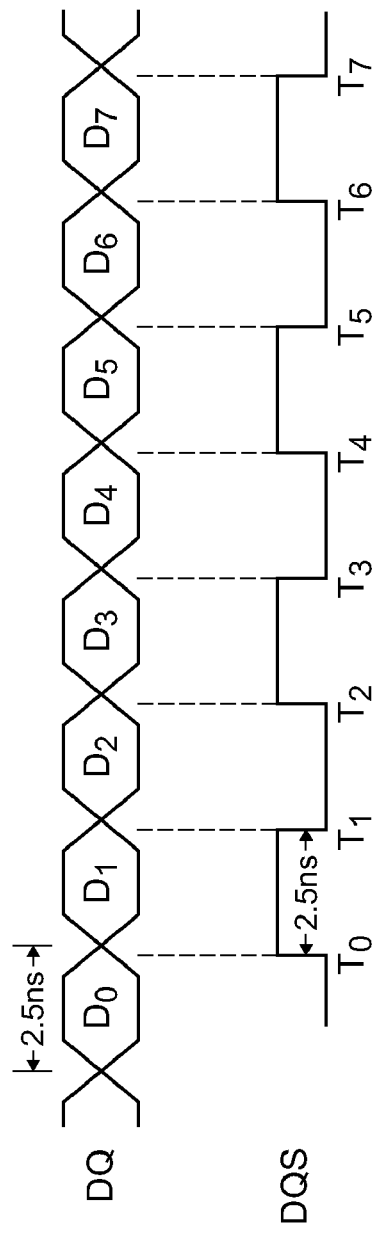
FIG. 2 illustrates defective timing sequences of a data signal and a data-triggering signal obtained by executing a conventional DDR data access method.
Figure 3:
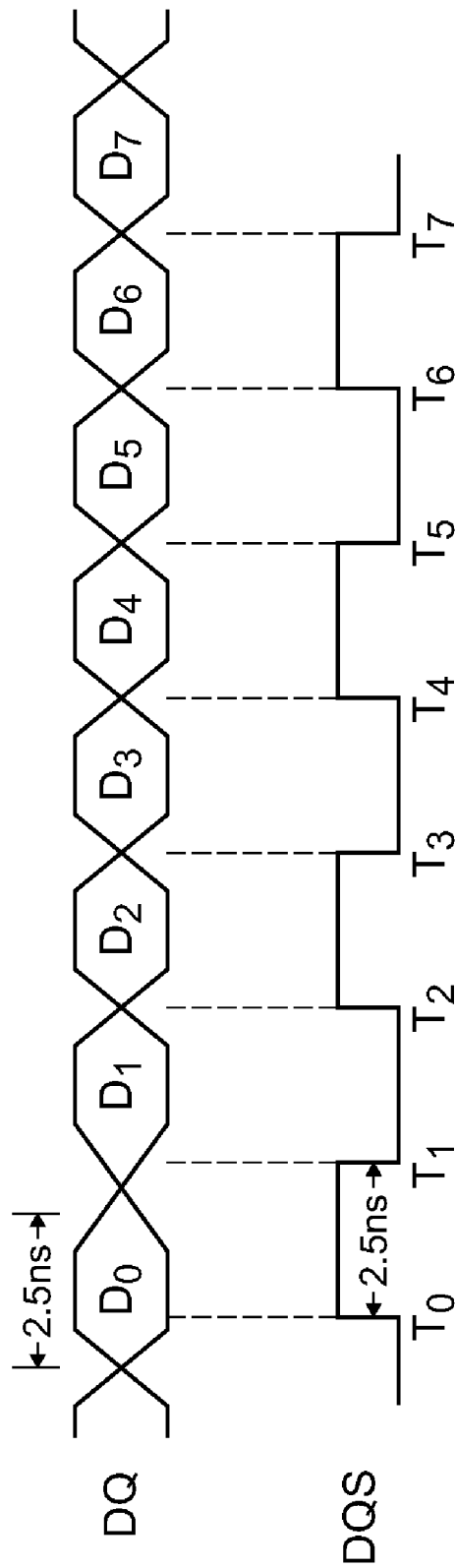
FIG. 3 illustrates another defective timing sequences of a data signal and a data-triggering signal obtained by executing a conventional DDR data access method.

In the second data access operation, the second type of data are written and read according to the conventional DDR accessing way as described above with reference to FIG. 1. That is, data sections are written into respective addresses in the memory 10 and accessed in response to both rising and falling edges of a data-triggering signal DQS. All the accessed data sections are then outputted to the application circuit 30 by the control unit 23 via the second interface unit 22. The DDR accessing way is advantageous in high data-accessing efficiency. Even if a phase shift as shown in FIG. 2 or a data-timing shift as shown in FIG. 3 occurs and thus data-accessing accuracy is affected, it is acceptable for the less important second type of data.

Figure 6:
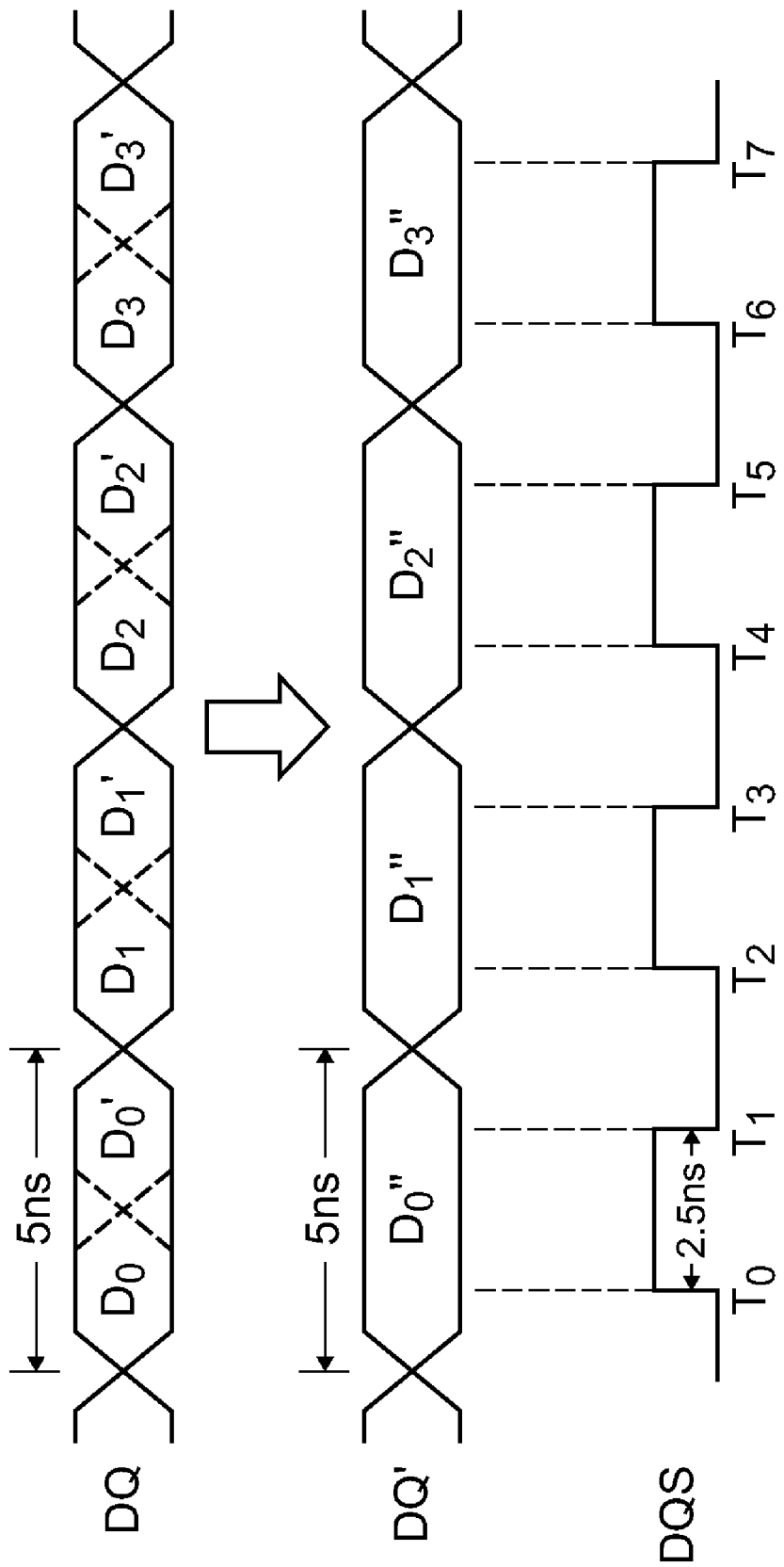
FIG. 6 illustrates an example of timing sequences of a first-type data signal and a data-triggering signal obtained by executing a data access method according to an embodiment of the present invention.

For the first type of data, on the other hand, high data-accessing accuracy is required. Thus the first data access operation includes a pre-processing step of the first type of data to lengthen the accessible period of each data section. That is, before a data of the first type is to be written into the DDR memory 10, the data is duplicated first. Then the original data and the duplicated data are both written into the memory at addresses that can be continuously accessed. Take the data signal DQ shown in FIG. 1 as an example. Each of the data sections D0, D1, D2, D3, . . . are duplicated, and the duplicated data sections D0', D1', D2', D3', . . . are written into the DDR memory 10 along with the original data sections D0, D1, D2, D3, . . . . Afterwards, the original and duplicated data sections are read continuously, as shown in FIG. 6. As a result, the accessible period of each data section is substantially doubled. An equivalent data signal DQ' consisting of D0", D1", D2", D3", . . . is shown in FIG. 6 for facilitating illustration. Under this circumstance, identical data contents, e.g. D0 and D0', are accessed in response to continuous rising and falling edges, e.g. T0 and T1, of the data-triggering signal DQS. After the data access operation is successfully performed, one of the repeated copies of a data section is discarded by the control unit 23 of the memory interface 20 and the other copy is outputted to the application circuit 30 by the control circuit unit 23 via the first interface unit 21.

Figure 7:
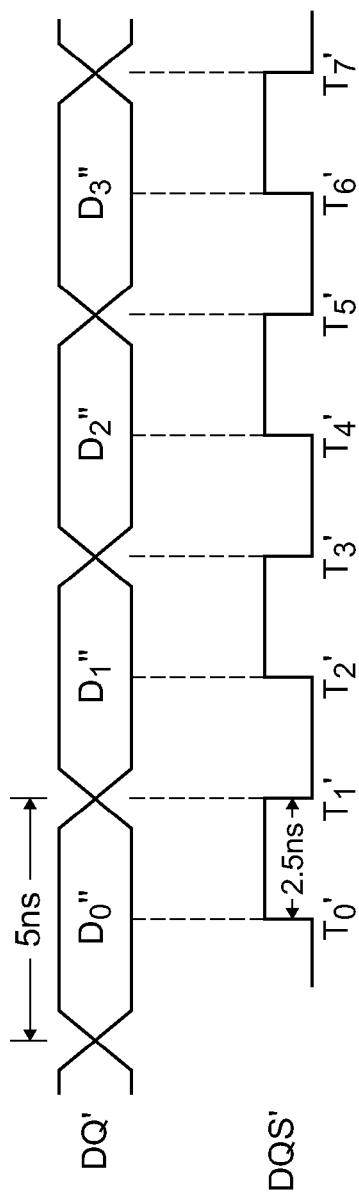
FIG. 7 illustrates another example of timing sequences of a first-type data signal and a data-triggering signal obtained by executing a data access method according to an embodiment of the present invention.

Due to the lengthened accessible period, each data section is accessed twice, one in response to a rising edge and the other in response to a falling edge. Accordingly, even if the data access suffers from a phase shift of a triggering signal DQS', as illustrated in FIG. 7, it would be affected only once (e.g. at T1'), and an accurate data can still be accessed (e.g. at T0'). Although data-accessing efficiency might be sacrificed in this case due to repeated data, it is acceptable in consideration of the importance of the first type of data.

It is understood from the timing sequence of FIG. 7 that correct data and defective data due to the phase shift of the triggering data signal periodically appear. Therefore, it is feasible to introduce a learning step to determine which of the identical data sections, i.e. the original one or the duplicated one, is constantly discarded. After it is realized that the data accessed at the rising edge T0' is outputted while the data accessed at the falling edge T1' is discarded, subsequent data-accessing operations can be executed only in response to rising edges. In this way, no data-discarding operation is needed. Of course, another phase shift of the triggering data signal may result in data-accessing operations executed only in response to falling edges.

Figure 8:
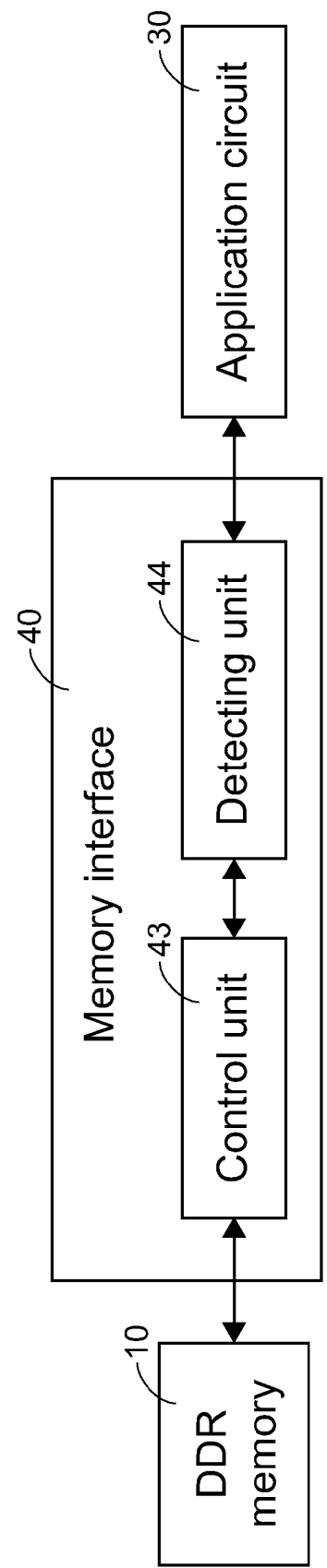
FIG. 8 is a schematic block diagram illustrating a second embodiment of memory interface according to the present invention.

FIG. 8 illustrates another embodiment of memory interface according to the present invention, wherein no divided paths are provided for transmitting different types of data. Instead, a detecting unit 44 is provided to determine which kind of data access operations is adopted. The data types can be identified according to destination addresses or specified codes tagged to the data to be accessed. If the data to be accessed by the application circuit 30 is the first type of data (of high importance), the first access operation as described above is executed by a control unit 43. On the contrary, if the data to be accessed by the application circuit 30 is the second type of data (of low importance), the second access operation as described above is executed by the control unit 43.

Figure 9:
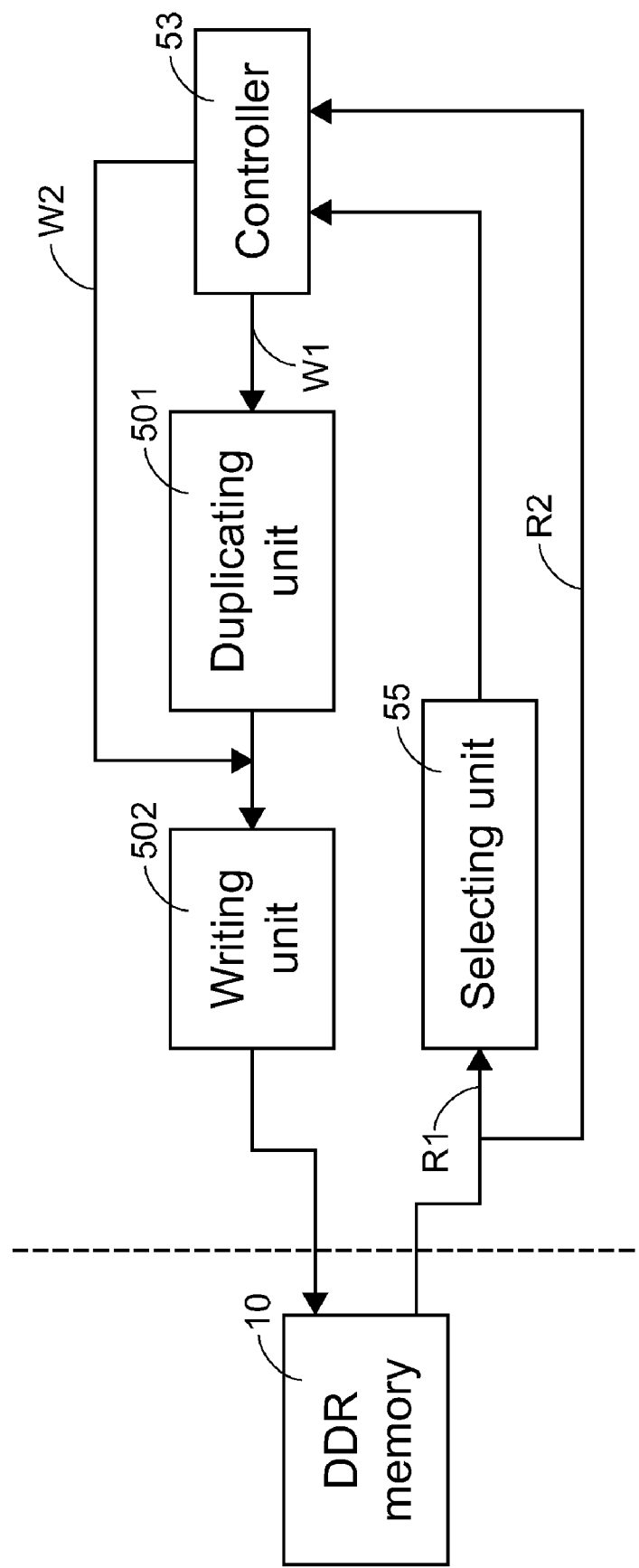
FIG. 9 is a schematic block diagram illustrating an embodiment of a control unit for use in the memory interface of FIG. 5 or FIG. 8 of the present invention.

As mentioned above, the control unit 23 of FIG. 5 or the control unit 43 of FIG. 8 executes a data-duplicating operation and a data-discarding operation for the first type of data while executing a general DDR access operation for the second type of data. The block diagram of FIG. 9 illustrates the work of such a control unit. The control unit includes a data-duplicating unit 501, a data-writing unit 502, a controller 53 and a data-selecting unit 55.

In the first data access operation, the first type of data is transmitted via the path W1 to be duplicated in the data-duplicating unit 501. Then the original and duplicated data are both written into the memory 10 by the data-writing unit 502. Afterwards, when the application circuit 30 issues a request to read the first type of data from the memory 10, the repeated data sections read in response to rising and falling edges, respectively, are transmitted via the path R1 to be screened by the selecting unit 55 so as to determine which one is to be outputted and which one is to be discarded. The controller 53 then outputs just one copy of the accessed data to the application circuit 30.

On the other hand, in the second data access operation, the second type of data is transmitted via the path W2 to be directly written into the memory 10 by the data-writing unit 502. Afterwards, when the application circuit 30 issues a request to read the second type of data from the memory 10, the data is outputted to the application circuit 30, while bypassing the selecting unit 55 (path R2). Accordingly, adaptive data access control can be performed depending on the requirement on data accuracy or data efficiency.

Figure 10:
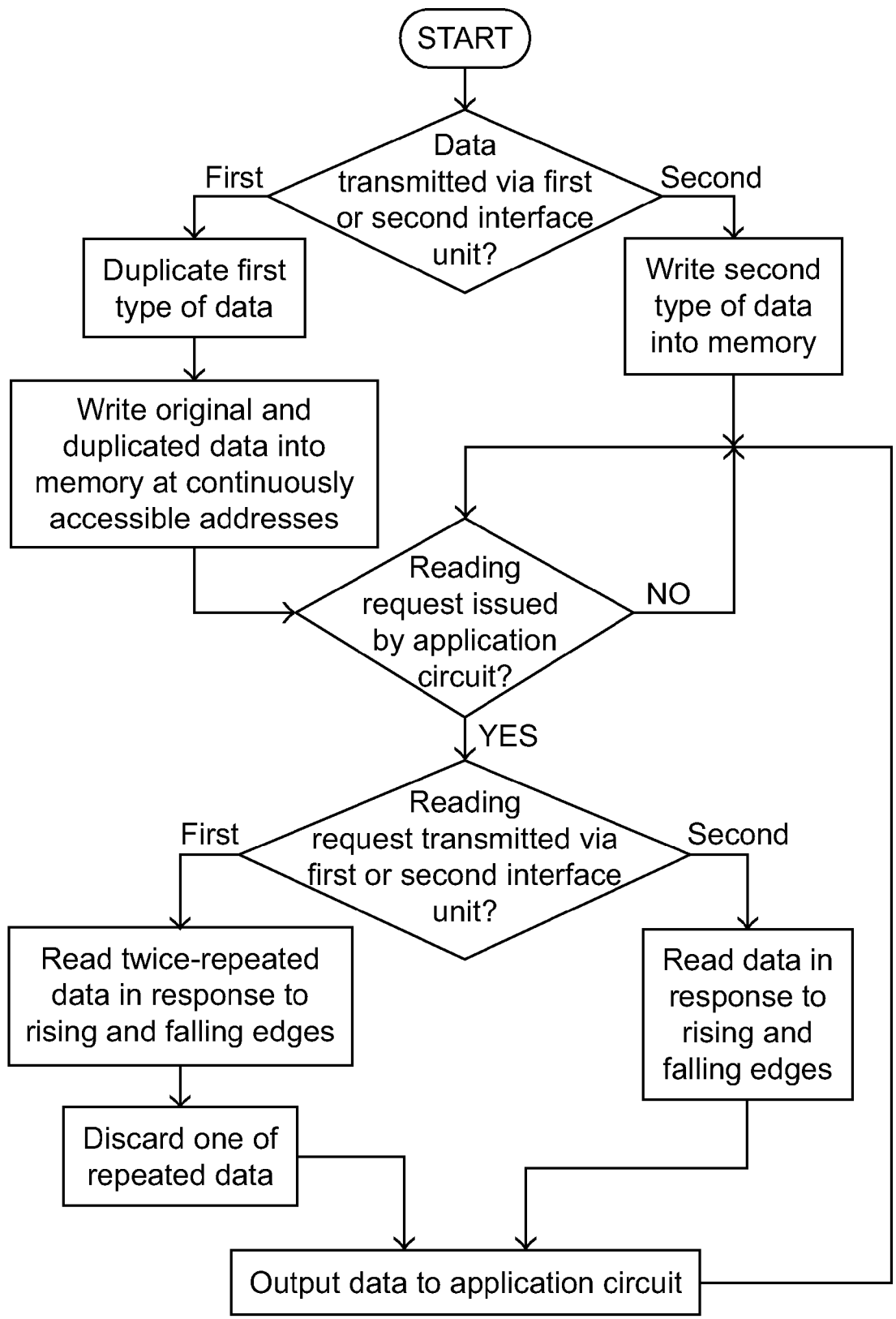
FIG. 10 is a flowchart briefly summarizing a data access method for use with the memory interface of FIG. 5.
Figure 11:
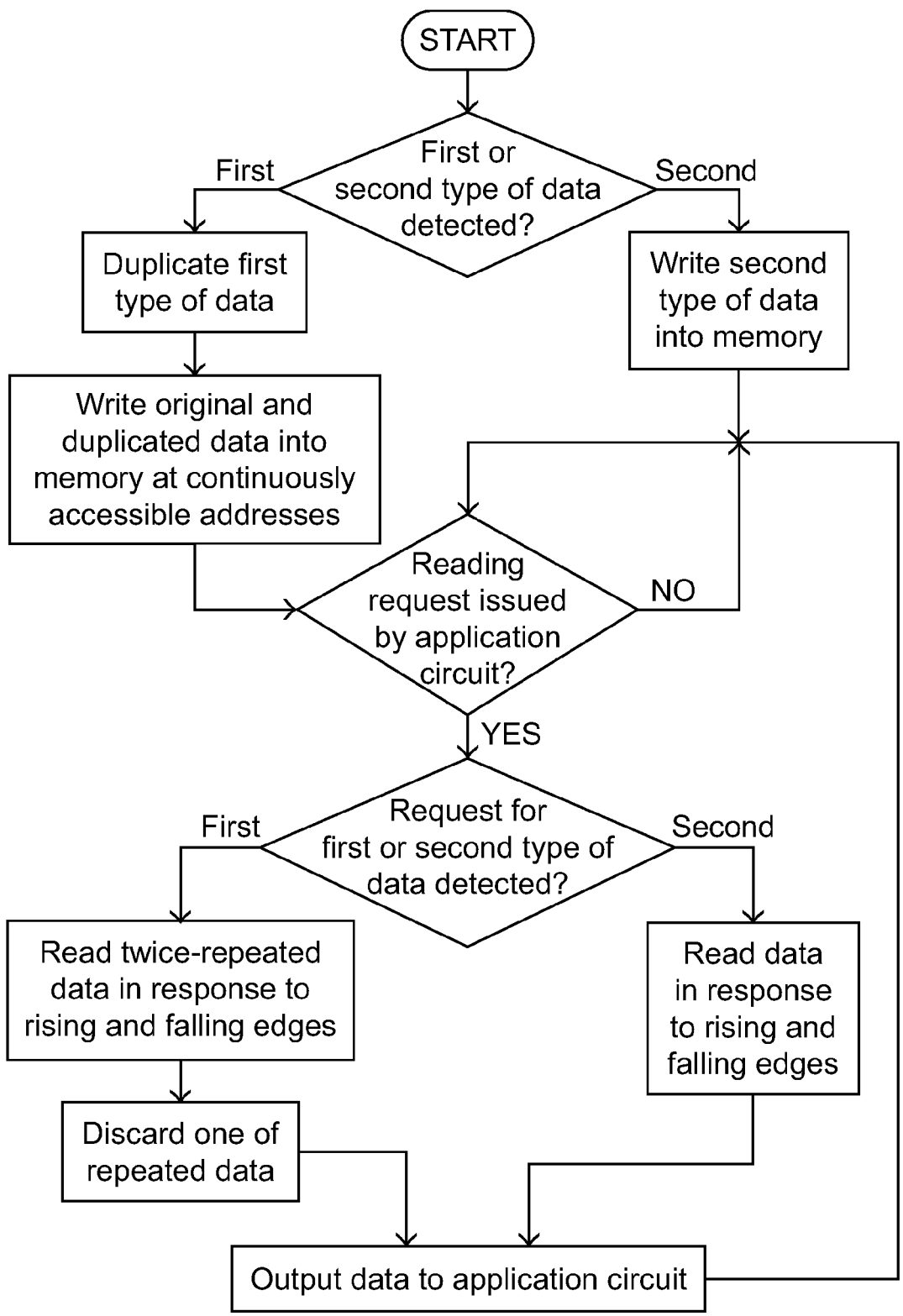
FIG. 11 is a flowchart briefly summarizing a data access method for use with the memory interface of FIG. 8.

FIG. 10 and FIG. 11 briefly summarize adaptive data access control according to the embodiments as shown in FIG. 5 and FIG. 8, respectively.

To sum up, the present invention utilizes adaptive data access ways to deal with different types of data. For the data requiring high accuracy, the present invention achieves this object by lengthening the accessible period. Otherwise, the data access is preferably, but not necessarily, performed at a high rate.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A data access method for an application circuit to access a memory, comprising steps of:
   receiving a first data from the application circuit;
   determining whether the first data is audio/video data;
   duplicating the first data to obtain a duplicated first data and writing the first data and the duplicated first data into the memory at continuously accessible addresses each time when the first data is not audio/video data; and
   writing only the first data into the memory when the first data is audio/video data.

2. The data access method according to claim 1 further comprising steps of:
   reading the first data from the memory in response to one of a rising edge and a falling edge of a data-triggering signal and the duplicated first data from the memory in response to the other of the rising edge and the falling edge of the data-triggering signal;
   determining whether an outputted data is read in response to the rising edge or the falling edge; and
   reading a subsequent first data or a duplicated first data corresponding to the subsequent first data from the memory in response to only the rising edge or falling edge resulting in the outputted data.

3. The data access method according to claim 2 further comprising steps of:
   discarding one of the first data and the duplicated first data while outputting the other of the first data and the duplicated first data to the application circuit.

4. The data access method according to claim 1 further comprising steps of:
   writing a second data which is received from the application circuit and classified as a second data type different from a first data type of the first data into the memory; and
   reading the second data from the memory and outputting the second data to the application circuit in response to both rising and falling edges of a data-triggering signal.

5. The data access method according to claim 4 wherein the second data is an audio/video data.

6. The data access method according to claim 1 wherein the first data is program codes or a data required for executing a system program.

7. A data access method for an application circuit to access a memory, comprising steps of:
   writing a first type of data and a second type of data into the memory, wherein the first type of data is program codes or data required for executing a system program and the second type of data is audio/video data;
   lengthening an accessible period of the first type of data rather than the second type of data each time by duplicating the first type of data and writing the duplicated first data into the memory at continuously accessible addresses; and
   reading the first type of data and the second type of data each in response to both rising and falling edges of a data-triggering signal.

8. The data access method according to claim 7 wherein the second type of data is read from the memory and outputted to the application circuit in response to both the rising and falling edges of the data-triggering signal.

9. The data access method according to claim 7 wherein the first type of data is read from the memory in response to both the rising and falling edges of the data-triggering signal and outputted to the application circuit in response to only one of the rising and falling edges of the data-triggering signal.

10. The data access method according to claim 7 wherein the accessible period of the first type of data is lengthen by:
   duplicating the first type of data and writing the duplicated data into the memory at an address accessible next to the original data; and triggering the reading of both the original data and the duplicated data within a single cycle of the data-triggering signal.

11. The data access method according to claim 10 further comprising a step of:
   discarding one of the original data and the duplicated data and outputting the other of the original data and the duplicated data to the application circuit.

12. A memory interface for an application circuit to access a memory, comprising:
   a first interface unit in communication with the application circuit for transmitting a first type of data between the application circuit and the memory;
   a second interface unit in communication with the application circuit for transmitting a second type of data between the application circuit and the memory; and
   a control unit in communication with the first interface unit, the second interface unit and the memory for conducting a first data access operation for the first type of data and conducting
   a second data access operation for the second type of data;
   wherein the first data access operation, including sequentially reading an original form of the first type of data and a duplication of the first type of data from the memory in a single cycle of a data-triggering signal, is conducted by the control unit when the first type of data is a program code or a data required for executing a system program each time;
   wherein the second data access operation is conducted by the control unit when the second type of data is audio/video data.

13. The memory interface according to claim 12 wherein the first data access operation and the second data access operation are performed in response to the same data-triggering signal but result in different data access rates.

14. The memory interface according to claim 12 wherein the control unit includes:
   a controller in communication with the first interface unit and the second interface unit for controlling one of the first data access operation and the second data access operation to be performed;
   a data-duplicating unit in communication with the controller for duplicating the first type of data when the first data access operation is performed;
   a data-writing unit coupled between the data-duplicating unit and the memory for writing the original and duplicated first type of data into the memory at continuously accessible addresses; and
   a selecting unit coupled between the memory and the controller for reading the original and duplicated first type of data and selecting one of the original and duplicated first type of data to be outputted to the application circuit.

15. The memory interface according to claim 14 wherein the second type of data bypasses the data-duplicating unit and is directly written into the memory by the data-writing unit.

16. The memory interface according to claim 14 wherein the second type of data bypasses the selecting unit and is read to be outputted to the application circuit in response to both rising and falling edges of a data-triggering signal.

17. A memory interface for an application circuit to access a memory, comprising:
   a detecting unit in communication with the application circuit for determining a data type of a data to be accessed by the application circuit; and
   a control unit in communication with the detecting unit and the memory for conducting a first data access operation when the data to be accessed is a first type of data and conducting a second data access operation when the data to be accessed is a second type of data;
   wherein the first data access operation, including sequentially reading an original first type of data and a duplicated first type of data having the same contents with each other, is conducted by the control unit when the first type of data is a program code or a data required for executing a system program each time;
   wherein the second data access operation is conducted by the control unit when the second type of data is audio/video data.

18. The memory interface according to claim 17 wherein the first data access operation and the second data access operation are performed in response to the same data-triggering signal but result in different data access rates.

19. The memory interface according to claim 17 wherein the control unit includes:
   a controller in communication with the detecting unit for controlling one of the first data access operation and the second data access operation to be performed according to the detected data type;
   a data-duplicating unit in communication with the controller for duplicating the first type of data when the first data access operation is performed;
   a data-writing unit coupled between the data-duplicating unit and the memory for writing the original and duplicated first type of data into the memory at continuously accessible addresses; and
   a selecting unit coupled between the memory and the controller for reading the original and duplicated first type of data and selecting one of the original and duplicated first type of data to be outputted to the application circuit.

20. The memory interface according to claim 17 wherein the second type of data bypasses the data-duplicating unit and is directly written into the memory by the data-writing unit in a data-writing process, and the second type of data bypasses the selecting unit and is read to be outputted to the application circuit in a data-reading process.

* * * * *